United States Patent
Utz et al.

(10) Patent No.: US 12,406,700 B2
(45) Date of Patent: Sep. 2, 2025

(54) SYSTEM AND METHOD FOR MODULAR HARD DRIVE ENCLOSURE WITH DEVICE COOLING

(71) Applicant: Dell Products L.P., Round Rock, TX (US)

(72) Inventors: James Utz, Austin, TX (US); Leslye Paniagua Sanchez, Leander, TX (US); Bilal Ahmed, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 348 days.

(21) Appl. No.: 18/319,935

(22) Filed: May 18, 2023

(65) Prior Publication Data

US 2024/0386917 A1    Nov. 21, 2024

(51) Int. Cl.
  *G11B 33/14*     (2006.01)
  *H05K 5/02*     (2006.01)

(52) U.S. Cl.
  CPC ......... *G11B 33/142* (2013.01); *H05K 5/0213* (2013.01); *H05K 5/026* (2013.01)

(58) Field of Classification Search
  CPC ..... G11B 33/142; H05K 5/0213; H05K 5/026
  USPC .......................................................... 165/80.3
  See application file for complete search history.

(56) References Cited

U.S. PATENT DOCUMENTS

| | | | |
|---|---|---|---|
| 9,678,546 B2* | 6/2017 | May | H05K 7/20409 |
| 11,310,936 B2* | 4/2022 | Saroor | G06F 1/203 |
| 2021/0092871 A1* | 3/2021 | Hur | H05K 7/20163 |
| 2023/0108414 A1* | 4/2023 | Jung | H05K 5/0213 |
| | | | 361/679.55 |

* cited by examiner

*Primary Examiner* — Steve S Tanenbaum
(74) *Attorney, Agent, or Firm* — WOMBLE BOND DICKINSON (US) LLP

(57) ABSTRACT

Methods, systems, and devices for providing computer implemented services are disclosed. To provide the computer implemented services, computing devices may use data stored in storage devices. When using the data stored on the storage devices, the storage devices may generate heat. To manage the heat generated by the storage devices, the storage devices may be positioned within housing structures that facilitate dissipation of the heat. Once positioned within the housing structures, the housing structures may be positioned within a module that facilitates operable connection with a storage controller while simultaneously enhancing the dissipation of the heat. The storage controller may manage the data stored on the storage devices to provide the computer implemented services.

20 Claims, 9 Drawing Sheets

SYSTEM AND METHOD FOR MODULAR HARD DRIVE ENCLOSURE WITH DEVICE COOLING

FIELD

Embodiments disclosed herein relate generally to device management. More particularly, embodiments disclosed herein relate to systems and methods for thermal management of devices in data processing systems.

BACKGROUND

Computing devices may provide computer implemented services. The computer implemented services may be used by users of the computing devices and/or devices operably connected to the computing devices. To provide the computer implemented services, computing devices may depend on data stored in storage devices.

BRIEF DESCRIPTION OF THE DRAWINGS

Embodiments disclosed herein are illustrated by way of example and not limitation in the figures of the accompanying drawings in which like references indicate similar elements.

DETAILED DESCRIPTION

Figure 1A:
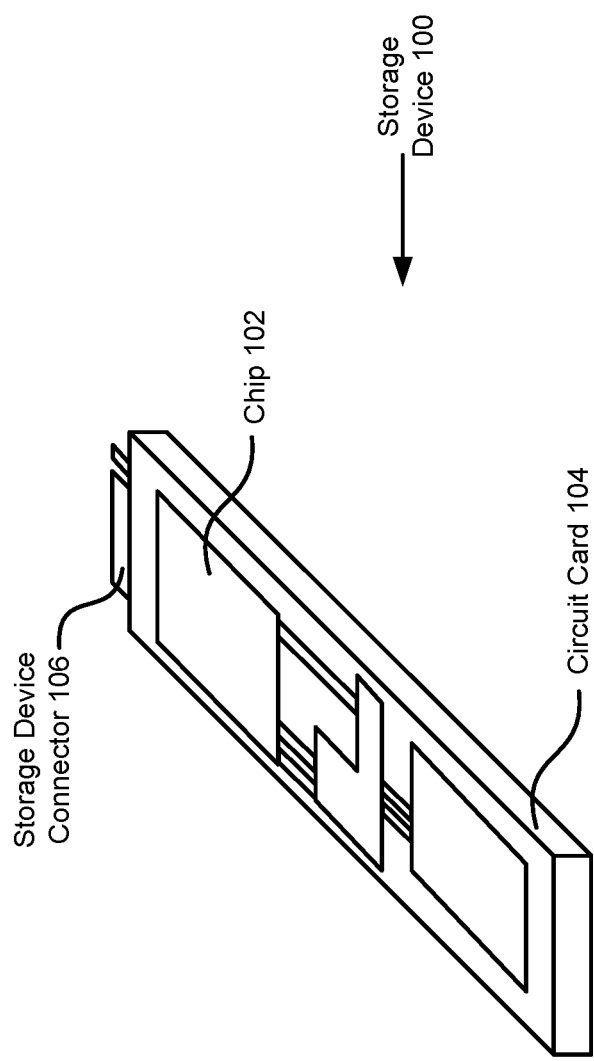
FIG. 1A shows a diagram illustrating a storage device in accordance with an embodiment.

Various embodiments will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment. The appearances of the phrases "in one embodiment" and "an embodiment" in various places in the specification do not necessarily all refer to the same embodiment.

References to an "operable connection" or "operably connected" means that a particular device is able to communicate with one or more other devices. The devices themselves may be directly connected to one another or may be indirectly connected to one another through any number of intermediary devices, such as in a network topology.

In general, embodiments disclosed herein relate to methods and systems for providing computer implemented services. The computer implemented services may include any type and/or quantity of computer implemented services. Furthermore, the type and/or quantity of the computer implemented services, and/or how the computer implemented services are to be provided, may depend on data stored on storage devices.

To provide the computer implemented services, a startup may be performed to initialize operation of a data processing system in preparation for providing the computer implemented services. This initialization may place the data processing system in the condition for providing the computer implemented services as intended by a consumer of the computer implemented services.

To perform the startup, the data stored on the storage devices may be used (e.g., the stored data may include basic input/output system "BIOS" code). However, using the storage devices to access the stored data may cause the storage devices to generate heat. This heat may cause undesired effects that delay and/or prevent the computer implemented services entirely.

To manage the heat generated by the storage devices, the data processing system may use a cooling system to cool components of the data processing system simultaneously. However, this method of cooling may cause an inefficient consumption of power due to an inability of the data processing system to granularly cool the components. For example, the components may be cooled regardless of needing cooling.

To enhance the cooling (and therefore, power consumption), the storage devices may be encased in housing structures that facilitate an enhanced dissipation of the heat (enhanced compared to dissipation of the heat with the housing structures). These housing structures may include individual housing per storage device and/or a module in which the storage devices (and respective individual housings) may be positioned.

By doing so, data processing systems, in which the storage devices are included, may be improved by enhancing heat dissipation from the storage devices, improving power consumption efficiency, and/or otherwise decreasing a likelihood of the computer implemented services being delayed and/or prevented entirely.

In an embodiment, a storage device is provided.

The storage device may include a circuit card, a chip: positioned on the circuit card, and adapted to: store data, and generate heat as a byproduct of storing data, and a connector: positioned with the circuit card, and adapted to facilitate formation of operable connections between the chip and other devices, and housing adapted to enhance thermal dissipation of the heat in an airflow, the housing may include: a housing top adapted to dissipate a first portion of heat, the housing top may include: ridges adapted to provide a surface area to which a first portion of the airflow is exposed, and a housing bottom adapted to dissipate a second portion of the heat, the housing bottom may include: air vents adapted to facilitate a second portion of the airflow that dissipates a first sub portion of the second portion of the heat.

The storage device may further include a module adapted to position the housing to be exposed to the airflow, comprising: a housing contact comprising a first set of air vents, guide rails comprising a second set of air vents, and a circuit card comprising a third set of air vents.

The housing may further include an interposer adapted to route the data stored in the storage device to a storage controller positioned on the module, the interposer may include: a housing edge connector: positioned with a rear end of the housing, adapted to facilitate formation of operable connections between the storage device and the module while the housing is positioned in the module; and an electrical storage connector: positioned on a circuit card of the interposer, the circuit card comprising the housing edge connector, and adapted to facilitate formation of operable connections between the storage device and the housing edge connector.

The first portion of the airflow is aligned with a length of the ridges.

The second portion of the airflow traverses from being outside of the housing, through the air vents of the housing bottom to an interior of the housing, and interacts with the storage device while the storage device is positioned in the housing.

The second portion of the airflow cools a portion of the storage device that is not substantially cooled by the housing through thermal conduction.

The second portion of the airflow further traverses through the second set of air vents while the storage device is positioned in the module.

The airflow comprises a third portion that traverses through the third set of air vents, and interacts with the housing bottom to dissipate a second sub portion of the second portion of the heat.

The module may also include: a storage controller adapted to manage access to data redundantly stored in the storage device and a second storage device.

The module may further include: the second storage device; and a second housing for housing the second storage device, wherein the second housing is substantially similar to the housing.

In an embodiment, a data processing system is provided that may include the storage device as discussed above.

In an embodiment, a method for thermally regulating a storage device comprises using a housing and a module to cool the storage device.

Turning to FIG. 1A, a diagram illustrating a storage device in accordance with an embodiment is shown. Storage device 100 shown in FIG. 1A may be used for boot optimized server storage (BOSS). Data stored on storage device 100, when read and/or executed, may place a data processing system in condition for providing computer implemented services.

For example, data stored on storage device 100 may include basic input/output system (BIOS) code. The BIOS may be used in preparation for handoff of control over the data processing system to an operating system. By handing control over the data processing system to the operating system, the data processing system may be placed in the condition for providing the computer implemented services. Thus, an ability for a data processing system to provide the computer implemented services may depend on the data stored in storage device 100 by virtue of the dependence on access to the data to enter an operating state necessary for handoff of control to the operating system.

The computer implemented services may include any type and quantity of computer implemented services. For example, the computer implemented services may include data storage services, database services, and/or any other type of service that may be implemented with a data processing system.

To provide the computer implemented services, a startup may, as noted above, be performed to initialize operation of the data processing system in preparation for providing the computer implemented services. This initialization may place the data processing system in the condition for providing the computer implemented services as intended by a consumer of the computer implemented services.

To initiate performance of the startup, the data processing system may be powered, restarted, and/or undergo startup via other processes. The startup may include (i) powering on the data processing system, (ii) completing a Power on Self-Test (POST), and/or (iii) based on an outcome of the POST, booting into an operating system based on the data stored in storage device 100 (e.g., the stored data may indicate a specific operating system to be hosted on the data processing system, the operating system image and/or other instructions may be stored on other storage devices other than storage device 100).

To provide its functionality, storage device 100 may include chip 102, circuit card 104, and storage device connector 106. Each of these is discussed below.

Chip 102 may include, for example, a packaged integrated circuit (e.g., "a computer chip"), individual components such as resistors or capacitors, and/or other types of hardware components. These components of chip 102 may facilitate storage of the data.

Circuit card 104, may be implemented with a structure on which Chip 102 (and/or other chips akin to chip 102 of storage device 100) is integrated. Circuit card 104 may include traces that interconnect (e.g., electrically) any chips (e.g., chip 102) and electrical contacts included in storage device 100.

Storage device connector 106 may be implemented with electrical contacts that may be operably connected to chip 102 via the traces, cabling, etc. Storage device connector 106 may be positioned/adapted to allow operable connection between storage device 100 (e.g., chip 102) and components of the data processing system. For example, when storage device 100 is installed into the data processing system, storage device connector 106 may make physical contact with other electrical contacts of the data processing system, thus facilitating the operable connection.

Thus, by including chip 102, circuit card 104, and storage device connector 106, storage device 100 may be capable of storing data that is to be provided to the data processing system.

However, while providing its functionality, storage device 100 may generate heat (e.g., the components of chip 102 may generate heat as electricity traverses through the computer chips). This heat may cause damage to storage device 100 and/or one or more components of the data processing system if the heat is not dissipated. For example, prolonged exposure to heat and/or exposure to a temperature due to the heat that is not within a functional range (e.g., range of heat in which components operate optimally) may cause undesired effects on the data processing system. These undesired effects may include physical damage, data corruption, high latency when executing operations, and/or other effects which may cause the computer implemented services to be delayed and/or prevented entirely.

While illustrated in FIG. 1A with an example topology, a storage device may include different types and/or arrangements of chips and electrical contacts, and/or different interconnection topologies facilitated by traces.

Figure 1B:
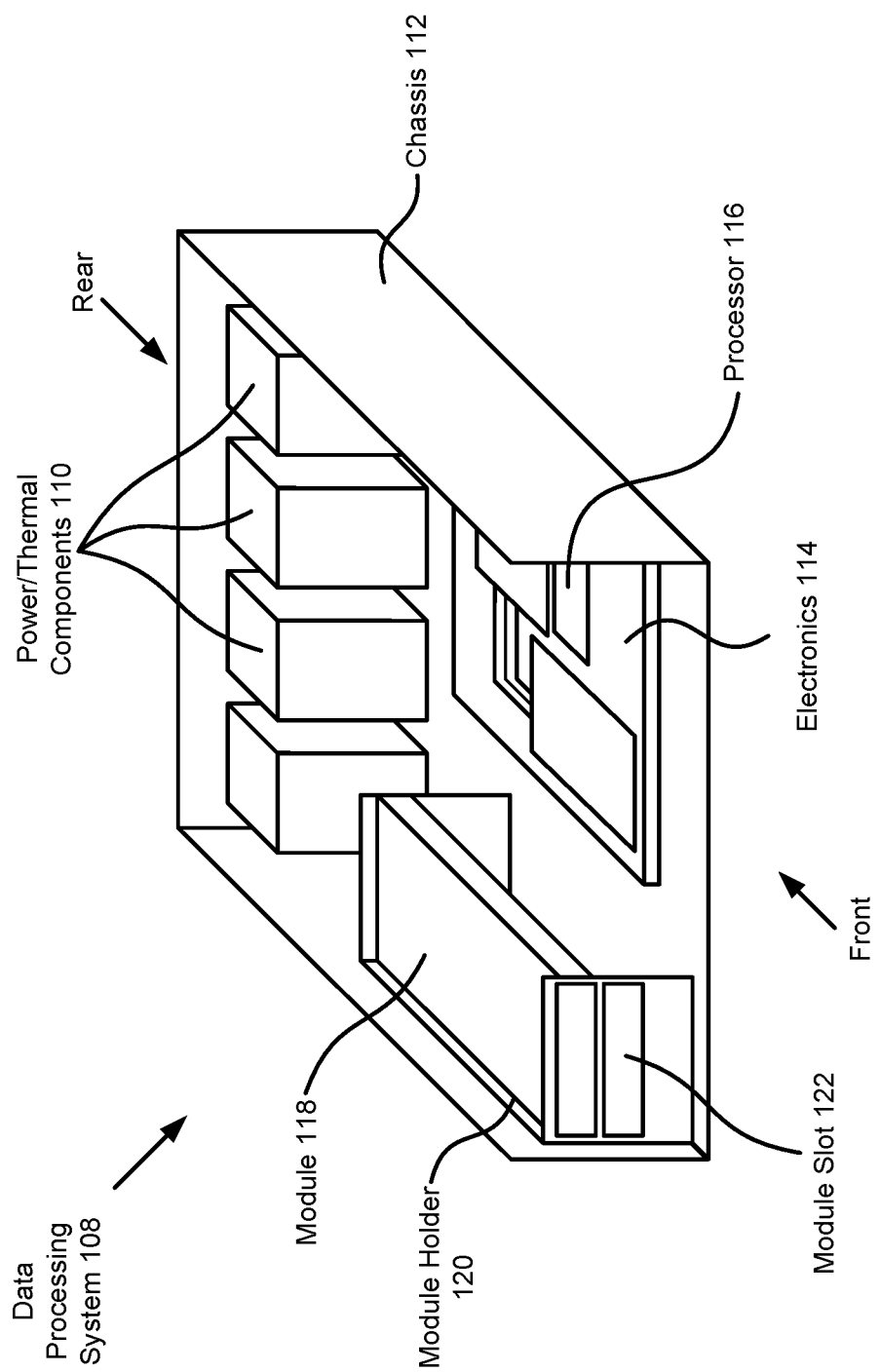
FIG. 1B shows a diagram illustrating a system in accordance with an embodiment.

To mitigate a likelihood of undesired effects caused by the heat, data processing systems may include thermal components (e.g., cooling systems) as seen in FIG. 1B (discussed below).

Turning to FIG. 1B, a diagram illustrating a data processing system in accordance with an embodiment is shown. To regulate the heat discussed above, data processing system 108 may facilitate cooling using power/thermal components 110. These thermal components may facilitate cooling by circulating a cooling medium (e.g., airflow) throughout a chassis (e.g., 112) of data processing system 108.

For example, assume storage device 100 (not explicitly shown in FIG. 1B) is installed in (i.e., inserted into, and operably connected to) data processing system 108. While providing its functionality, storage device 100 may generate heat (as previously discussed) while facilitating access to data used to startup data processing system 108. To dissipate the heat from storage device 100, the thermal components may initiate cooling of storage device 100 using, for example, fans to circulate air throughout chassis 112. By circulating the air throughout chassis 112, the heat may be dissipated through convection.

However, this method of cooling may cause an inefficient consumption of power by the thermal components if only storage device 100 is sufficiently warm to benefit from the cooling. This inefficient consumption of power may be due to an inability of the thermal components to granularly cool components of data processing system 108. For example, the thermal components may be unable to cool storage device 100 without also cooling other components of data processing system 108. Thus, power may be consumed to cool both (i) storage device 100, and (ii) components that may not require cooling (or at least cooling at as high of a cooling rate as is required to cool storage device 100).

In general, embodiments disclosed herein may provide methods, systems, and/or devices for enhancing thermal dissipation of heat from a storage device in a manner that increases a likelihood of efficient power consumption by a data processing system. To do so, embodiments disclosed herein may provide enhanced airflow to the storage device as well as enhanced conduction of heat away from the storage device. Consequently, the enhanced airflow may increase the dissipation of heat from the storage device, and therefore, may allow the data processing system to consume less power (compared to power consumed without the enhanced airflow) to maintain operable conditions for components of the data processing system.

To provide the above functionality, a data processing system (e.g., 108) in accordance with an embodiment may include various components such as electronics 114, processor 116, power/thermal components 110, module 118, module holder 120, and module slot 122. Each of these components is discussed further below.

Electronics 114 may provide various functionalities that depend on the data stored in storage device 100, such as preparing data processing system 108 for providing the computer implemented services. For example, electronics 114 may, once data processing system 108 is powered, depend on the data stored on storage device 100 to (i) facilitate the POST, (ii) load into an operating system, (iii) implement system configurations, and/or (iv) facilitate other procedures that prepare data processing system 108 for providing the computer implemented services.

To provide its functionality, electronics 114 may include various types of hardware components such as processors (e.g., 116), memory modules, storage devices (e.g., 100), communications devices, and/or other types of devices. Any of these hardware components may be operably connected to one another using circuit card traces, cabling, connectors, etc.

Power/thermal components 110 may provide power to any of the components of data processing system 108 and/or thermally manage any of the components of data processing system 108 (as previously discussed). For example, power/thermal components 110 may include power supplies, fans, and/or other types of devices usable to power and/or thermally manage the components.

Module 118 may provide operable connection (and thus, facilitate communication) between storage device 100 and electronics 114. To provide this functionality, module 118 may include a storage controller (not shown in FIG. 1B) that manages available storage devices (e.g., 100) made available by being operably connected to module 118. For example, the storage controller may be implemented with a RAID ("redundant array of independent disks") controller. The RAID controller may, for example, (i) combine and/or otherwise utilize the storages of more than one storage device (operably connected to module 118) to obtain a single, larger storage, and/or (ii) create redundancy (using more than one storage device) to increase a likelihood of data usability in the event of a storage device failure.

Module 118 may be implemented using a structure for holding storage devices. The structure may enclose a volume in which storage devices may be positioned. Furthermore, module 118 may include at least a portion of features adapted to enhance the dissipation of the heat. For additional information regarding module 118, the storage devices, and/or the features adapted to enhance the dissipation of the heat, refer FIGS. 1C-1H.

Module holder 120 may facilitate placement of, and/or interconnection of, module 118 with electronics 114. To do so, module holder 120 may include one or more cage-like structures, and/or other structures, adapted to hold (maintain placement of) one or more modules (e.g., 118). While holding module 118, module holder 120 may facilitate the interconnection by enabling physical contact between electrical contacts of module 118 and electronics 114.

Module slot 122 may enable accessible insertion of storage devices (e.g., 100), and/or the one or more modules (e.g., 118), into data processing system 108. To do so, module slot 122 may be implemented with one or more gaps on a side of chassis 112. The one or more gaps may provide unobstructed space in which insertion of devices may be possible without manipulation to chassis 112 (e.g., without detaching/dismantling any portion of chassis 112).

While illustrated in FIG. 1B with a limited number of specific components, a data processing system may include additional, fewer, and/or different components without departing from embodiments disclosed herein.

Figure 1C:
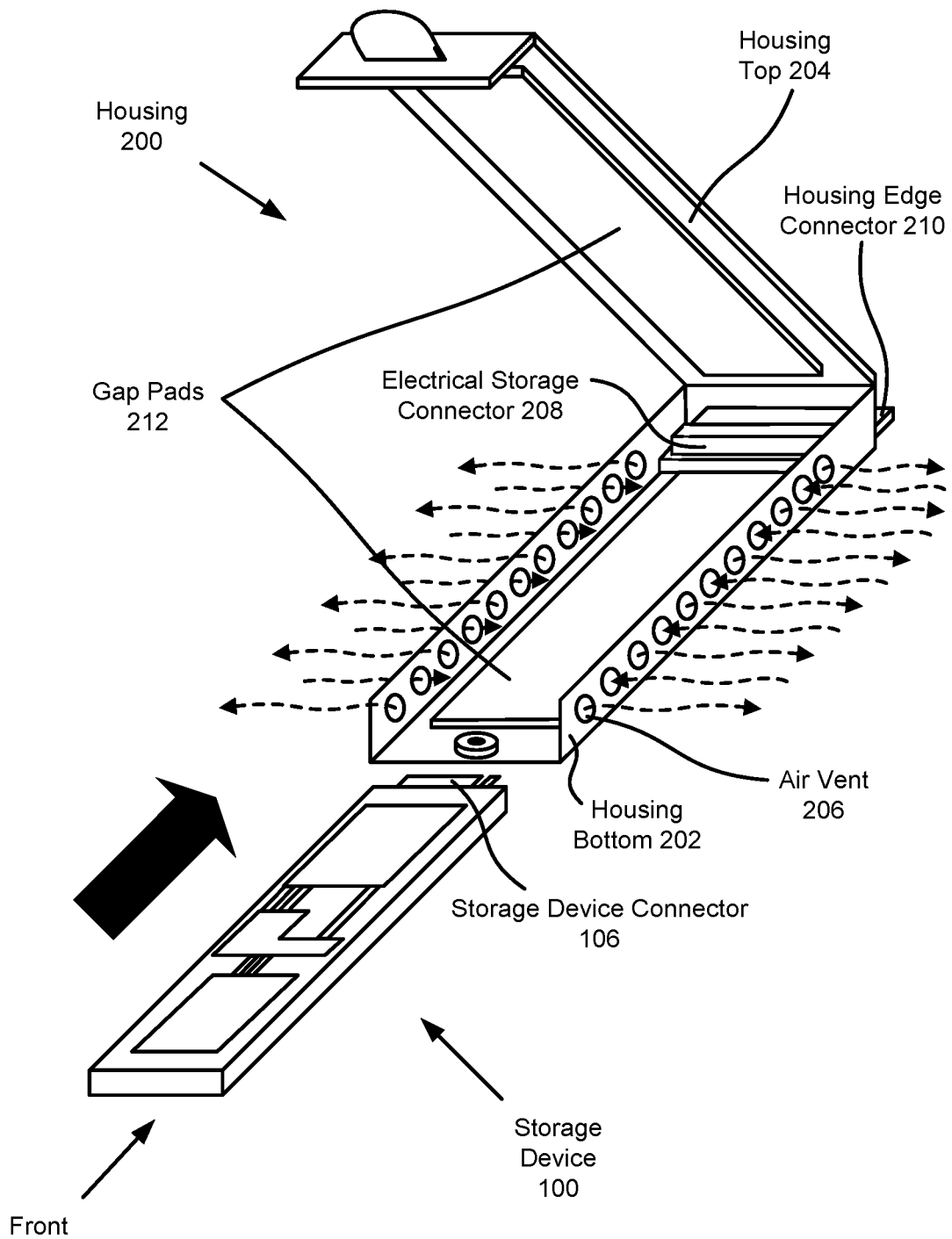
FIG. 1C-1D show diagrams illustrating a housing for a storage device in accordance with an embodiment.
Figure 1D:
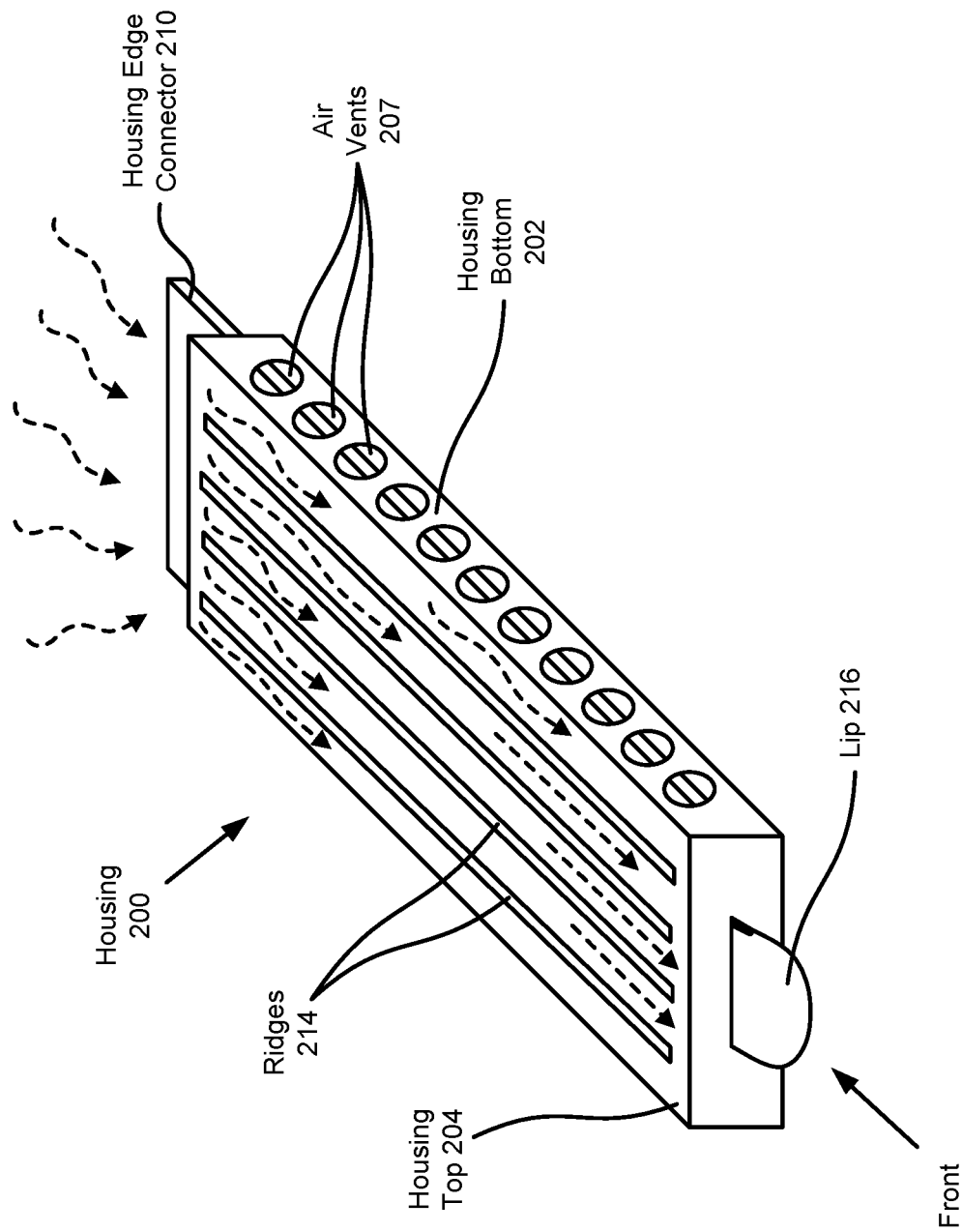

Turning to FIGS. 1C-1D, diagrams illustrating a storage device (e.g., 100) and housing 200 in accordance with an embodiment are shown. As discussed above, storage device 100 may store data that when read and/or executed may place a data processing system (e.g., 108) in condition for providing computer implemented services. Additionally, while providing its functionality, storage device 100 may generate heat. To dissipate this heat (to maintain operable conditions for components of the data processing system), a cooling system may consume power to cool both (i) storage device 100 and (ii) other components that may not require cooling.

To enhance the dissipation the heat (and thereby decrease the power consumed to cool storage device 100), storage device 100 may include a housing structure (e.g., housing 200, FIG. 1C). This housing structure may provide for airflow to the storage device as well as conduct heat away from the storage device.

Turning to FIG. 1C, a first diagram of housing 200 in accordance with an embodiment is shown. Housing 200 may house storage device 100 using a structure that substantially surrounds storage device 100.

As seen in FIG. 1C, housing 200 may include housing bottom 202 and housing top 204. Housing bottom 202 and housing top 204 may be positioned with one another in a manner that allows for housing 200 to be opened (as shown in FIG. 1C) and/or closed (as shown in FIG. 1D). By including housing bottom 202 and housing top 204, housing 200 may allow placement of storage device 100 within an interior of housing 200 (the allowable placement being indicated by an oversized arrow with black infill depicted to the left of storage device 100).

Housing 200 (and thus, housing bottom 202 and housing top 204) may be implemented with a shell, walls, and/or other structures that partially or totally surround storage device 100. Housing 200 may provide a degree of physical protection, may guide airflow proximate to storage device 100, may conduct heat away from storage device 100, and/or may perform other functions. To provide each of these functionalities, housing bottom 202 and housing top 204 may include various features, discussed below.

Housing bottom 202 may include air vents (e.g., 206), an interposer (e.g., 208 and 210), and at least one of gap pads 212. Each of these features of housing bottom 202 is discussed below.

The air vents (e.g., 206, and 207 in FIG. 1D) may be implemented with a number of gaps (e.g., holes) positioned on either lateral side of housing bottom 202 (e.g., in lateral walls extending from housing bottom 202). The air vents may be adapted (e.g., have sizes/shapes/numbers, be positioned to, etc.) to facilitate at least a portion of airflow being circulated by, for example, the cooling system proximate to storage device 100 while storage device 100 is housed in housing 200 (e.g., with housing top 204 being closed as shown in FIG. 1D).

It will be appreciated that various portions of the airflow are illustrated in FIGS. 1C-1H using wavy, dashed lines, and a direction of flow for each dashed line being indicated by arrows.

By allowing air to flow in and/or out of each air vent (the air contacting various portions of storage device 100 responsible for generating various respective portions of the heat), dissipation of the heat by convection may be enhanced. The airflow may cool, for example, portions of storage device 100 that are not cooled sufficiently via conduction provided by gap pads 212, discussed in greater detail below.

The interposer may be adapted to facilitate operable connections between storage device 100 and other devices to be formed while storage device 100 is positioned in housing 200). For example, the operable connections may facilitate routing of data stored in storage device 100 to a storage controller (not explicitly shown) positioned on module 118, discussed with respect to FIG. 1E. To provide its functionality, the interposer may include electrical storage connector 208 and housing edge connector 210, each of which is discussed below.

Electrical storage connector 208 may be a first portion of the interposer. Electrical storage connector 208 may be implemented with electrical contacts positioned with a rear end of housing 200. These electrical contacts of 208 may be adapted to make physical contact with storage device connector 106. To make this physical contact, storage device 100 may be positioned (e.g., placed) within housing 200. By making this physical contact, electrical storage connector 208 may facilitate operable connection to storage device connector 106.

Housing edge connector 210 may be a second portion of the interposer. Similar to electrical storage connector 208, housing edge connector 210 may be implemented with other electrical contacts. These other electrical contacts may be positioned to make physical contact with electrical storage connector 208 and module 118.

Accordingly, respective operable connections between (i) storage device connector 106 and electrical storage connector 208, (ii) electrical storage connector 208 and housing edge connector 210, and/or (ii) housing edge connector 210 and module 118 (e.g., the storage controller included in module 118), may be facilitated by the interposer. Thus, the interposer may enable data to be routed between storage device 100 and the storage controller via these operable connections.

To further enhance cooling, gap pads 212 may be positioned on housing top 204 and/or housing bottom 202. The gap pads may conduct at least a portion of the heat generated by storage device 100. To do so, gap pads 212 may be implemented with one or more thermally conductive, malleable structures positioned to make physical contact with various portions of storage device 100. These thermally conductive, malleable structures may be adapted to conform to the shape of surrounding components.

For example, when one of gap pads 212 is pressed against a surface of storage device 100, the gap pad may conform to the shape of various components (e.g., resistors and/or capacitors) protruding from the surface. The gap pad may conform to the shape of the various components without damaging the various components and/or otherwise causing undesired affects to storage device 100. Thus, physical contact between gap pads 212 and storage device 100 may be optimized to enable conduction of the heat away from storage device 100, and toward an external surface of housing 200.

Additionally, it will be appreciated that housing top 204 may include at least a second one of gap pads 212.

However, contact with all of storage device 100 may not be made through gap pads 212. Consequently, some portions of storage device 100 may substantially cooled by the airflow through air vents (e.g., 206).

To further the discussion of housing 200, and for additional information regarding housing top 204, refer FIG. 1D below.

Turning to FIG. 1D, a second diagram of housing 200 in accordance with an embodiment is shown. As discussed above, housing 200 (housing bottom 202 and housing top 204) may provide a degree of physical protection, may guide airflow proximate to storage device 100, may conduct heat away from storage device 100, and/or may perform other functions. To provide the above noted functionalities, housing top 204 may include ridges 214 and lip 216, each of which is discussed below.

Ridges 214 may dissipate at least a portion of the heat generated by storage device 100. Ridges 214 may facilitate the dissipation by conduction and/or convection. To dissipate the heat (e.g., by conduction), ridges 214 may be implemented with thermally conductive material (e.g., aluminum) positioned on an exterior (e.g., top) surface of housing top 204. Due to the thermally conductive properties of ridges 214, physical contact between thermally conductive material of housing 200 (the exterior surface) and the conductive material of ridges 214 may facilitate a thermal conduction path from storage device 100 and the ambient environment. Thus, ridges 214 may provide additional surface area (e.g., to a surface area of housing 200) through which heat from storage device 100 is dissipated.

Additionally, to dissipate the heat (e.g., by convection), ridges 214 may include protrusions (e.g., as shown in FIG. 1D) that extend away from the exterior surface of housing top 204. The protrusions may be positioned (e.g., spaced from one another) in a manner that results in a formation of airflow channels (through which at least a portion of the airflow traverses, the airflow depicted using wavy dashed lines) between the protrusions of ridges 214. Thus, as the heat is conducted to the surface area of ridges 214, air guided by the airflow channels may transfer at least a portion of the heat away from housing 200 by convection. The ridges and channels may generally be aligned with a length of housing 200, and may extend from one end where housing edge connector 210 is positioned to the other end of the length of housing 200.

Therefore, by facilitating the dissipation by conduction and/or convection, ridges 214 may enhance the dissipation of the heat generated by storage device 100.

The bottom side of housing 200 (not shown) may or may not also include ridges 214, and/or other structures that may serve as heatsinks.

Lip 216 may enable accessible insertion and/or extraction of storage device 100 from module 118. To do so, for example, lip 216 may be implemented by a structure that protrudes away from a front, exterior surface of housing 200. Lip 216 may provide a point of physical contact at which a position of housing 200 (and/or storage device 100) may be modified.

For example, while housing 200 is positioned in module 118 (e.g., installed in data processing system 108), lip 216 may protrude from module slot 122 of chassis 112 (shown in FIG. 1B). To extract housing 200 from module 118, lip 216 may be grabbed and pulled through module slot 122. By doing so, housing 200 (structurally attached to lip 216) may also be pulled through module slot 122 and removed from chassis 112. Similarly, lip 216 may be pushed through module slot 122, inserted into chassis 112, and positioned within module 118 to facilitate operable connection with data processing system 108.

While shown in FIG. 1D as having a specific shape, lip 216 may be implemented differently. For example, lip 216 may be implemented as or as part of a retention and/or release mechanism for housing 200 with respect to module 118. While not shown, such release mechanisms may retain housing 200 within module 118 until actuated by a person and, at which point, housing 200 may be removed from module 118.

Additionally, while illustrated as having an attachment mechanism (to attach housing top 204 to housing bottom 202) implemented with a hinge, it will be appreciated that housing top 204 and housing bottom 202 may be attached using different mechanisms without departing from embodiments herein. For example, housing top 204 may be implemented as a discrete heatsink that may be attachable to housing bottom 202 using screws. Consequently, each housing top may be attached to a respective housing bottom using the screws to enclose a storage device (e.g., 100).

Thus, while illustrated in FIGS. 1C-1D with a limited number of specific components, a housing structure adapted to house a storage device may include additional, fewer, and/or different components without departing from embodiments disclosed herein.

Turning to FIGS. 1E-1H, diagrams illustrating a module (e.g., 118) in accordance with an embodiment are shown. As previously discussed, module 118 may hold storage devices housed in housings. While doing so, module 118 may facilitate operable connection between the storage devices (e.g., 100) and data processing system 108 (using the storage controller, previously discussed). Furthermore, module 118 may be adapted to enhance the dissipation of the heat generated by storage device 100.

To provide its functionality, module 118 may include various components and/or features, each of which is discussed below with regard to FIGS. 1E-1H.

Figure 1E:
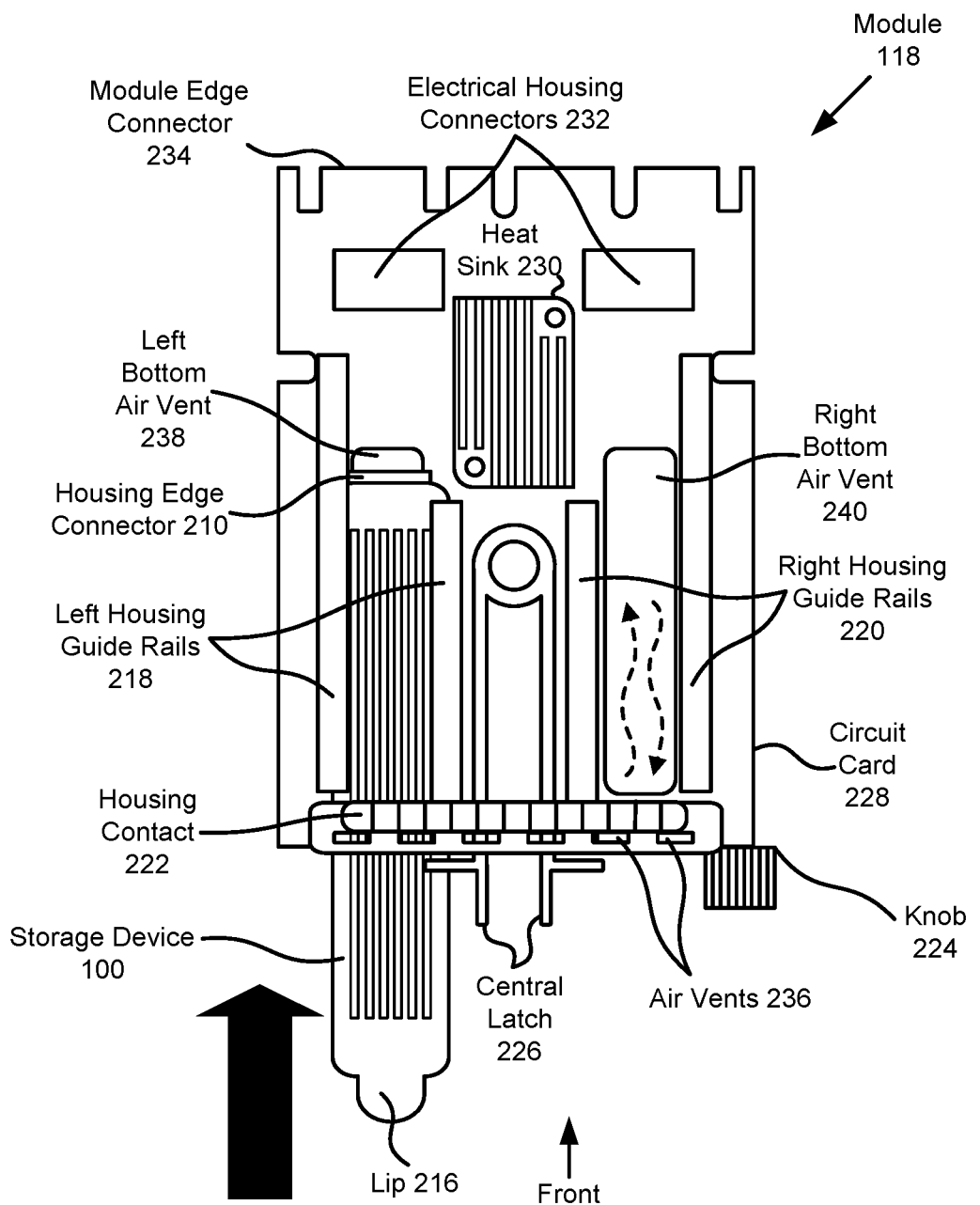
FIG. 1E-1H show diagrams illustrating a module for holding storage devices in accordance with an embodiment.

Turning to FIG. 1E, a diagram illustrating a top view of module 118 in accordance with an embodiment is shown. As shown in FIG. 1E, a storage device (e.g., 100) in a housing (e.g., 200) may be inserted (e.g., placed, the allowable placement being indicated by an oversized arrow with black infill depicted to the left of storage device 100) into one of two positions in module 118. In FIG. 1E, storage device 100 is illustrated positioned in a housing which is partially inserted into module 118.

Storage device 100 may be bound to a first position of the two positions by, for example, left housing guide rails 218. Alternatively, storage device 100 may be bound to a second position of the two positions by, for example, right housing guide rails 220.

Left and/or right housing guide rails 218-220 may be implemented using rail structures on which storage devices (e.g., housing 200) may be placed along and/or within. The rail structures may be positioned to restrict movement of the storage devices to a linear motion (e.g., from a front end of module 118 to a rear end of module 118 and/or the rear end of module 118 to the front end of module 118). By doing so, the housing guide rails enable the insertion and/or removal of storage devices from a front end of module 118 while maintaining alignment for operable connection (discussed further below). For additional information regarding the housing guide rails, refer to FIG. 1G.

Additionally, to hold storage devices (e.g., 100) in either of the two positions, module 118 may include housing contact 222, knob 224, and central latch 226. Each of these is discussed below.

Housing contact 222 may be adapted to, for example, secure housing 200 to module 118 once housing 200 (and thus, storage device 100) is inserted and operably connected to data processing system 108. For example, housing contact 222 may be manipulated using knob 224 to constrict (or release) a portion of housing 200 proximate to the front end of module 118. Knob 224 may be actuated (e.g., rotated clockwise/counterclockwise) to cause the constriction or release of housing contact 222 around housing 200. To do so, housing contact 222 may be implemented with a plastic injection molded structure. For example, this structure may be shaped like a clamp.

Central latch 226 may also be adapted to secure housing 200 to module 118 once housing 200 (and thus, storage device 100) is inserted and operably connected to data processing system 108. However, central latch 226 may not constrict (or release) housing 200 in same a manner as housing contact 222. For example, central latch may instead have a shape in which removal of housing 200 may be restricted unless a portion of central latch 226 is actuated (e.g., moved/forced away from one of the two positions to allow space for removal, or insertion, of housing 200). To do so, central latch 226 may be implemented with a flexible structure.

While illustrated and described as using central latch 226 for retention purposes, it will be appreciated that the housing and storage devices may be retained in module 118 using different mechanisms without departing from embodiments herein. For example, latches or other structures may be directly integrated with housing 200. Consequently, each housing may be separately detained in module 118. In such a scenario the latch may be positioned near lip 216 and/or may fully replace lip 216 (may operate as gripping mechanism for a person.)

Although illustrated and described with specific structures, housing contact 222, knob 224, and/or central latch 226 may include different types of structures (and in different positions) adapted to secure housing 200 to module 118. For example, the functionality of central latch 226 may be performed by portions of a housing in which storage device 100 is positioned.

As previously discussed, storage device 100 may be inserted (e.g., placed, the allowable placement being indicated by an oversized arrow with black infill depicted to the left of storage device 100) into one of two positions in module 118. Once positioned in either of the two positions, storage device 100 may be operably connected to the storage controller (and thus, may be operably connected to data processing system 108). Two different storage devices may be positioned in the respective positions.

It will be appreciated that, although not explicitly shown, the storage controller may be positioned between a circuit card (e.g., 228) of module 118 and heat sink 230 (used to dissipate heat from the storage controller). Additionally, it will be appreciated that a positioning of the storage controller may differ without departing from embodiments disclosed herein.

To facilitate the operable connection, module 118 may include electrical housing connectors 232 and module edge connector 234. Each of these is discussed below.

Electrical housing connectors 232 may route the data (routed by the interposer, discussed in FIG. 1C, from storage device 100) to the storage controller. To do so, electrical housing connectors 232 may be implemented with electrical contacts positioned toward a rear end of module 118. These electrical contacts of 232 may be adapted to make physical contact with the interposer of housing 200 and electrical contacts of (e.g., traces connected to) the storage controller. To make this physical contact, storage device 100 may be positioned (e.g., placed) within either of the two positions. By making this physical contact, electrical housing connectors 232 may facilitate operable connection to the storage controller.

Module edge connector 234 may be adapted to facilitate operable connection between the storage controller and data processing system 108. Similar to electrical housing connectors 232, module edge connector 234 may be implemented with other electrical contacts. These other electrical contacts may be positioned to make physical contact between electrical contacts of the storage controller and electrical contacts of data processing system 108 (e.g., electronics 114). By making this physical contact, module edge connector 234 may facilitate operable connection of the storage controller to electronics 114.

While not shown in FIG. 118, various electrical lines (e.g., traces) may electrically connect module edge connector 234 and electrical housing connectors 232.

Although illustrated in FIG. 1E with an example topology, a module (e.g., 118) may include different types and/or arrangements of electrical contacts and/or different interconnection topologies facilitated by traces.

In addition to holding storage devices (e.g., 100) and facilitating operable connections between the storage devices and data processing systems (e.g., 108), modules (e.g., 118) may be adapted to, as previously mentioned, enhance dissipation of heat generated by the storage devices. To do so, module 118 may include various features such as air vents 236, left bottom air vent 238, and right bottom air vent 240. Each of these features is discussed below.

Similar to air vents 206-207 (discussed with regard to FIGS. 1C-1D), air vents 236-240 may be adapted to facilitate at least a portion of airflow being circulated by, for example, the cooling system mentioned with regard to FIG. 1B.

To facilitate (at least a portion of) the airflow, air vents 236 may be implemented as a number of gaps positioned on a front side of module 118 (e.g., air vents 236 may be gaps in the structure of housing contact 222). For example, air flow guided by the airflow channels (resulting from the shape of ridges 214, discussed with regard to FIG. 1D) may be further guided through air vents 236. Thus, the airflow may be guided through the front of module 118, through module slot 122, and away from storage device 100 (and thus, away from data processing system 108). By guiding the airflow away from storage device 100 using air vents to facilitate the guidance, the dissipation of the heat may be enhanced.

To further facilitate (at least a portion of) the airflow, left and/or right bottom air vent 238-240 may be implemented as gaps in circuit card 228 positioned on a bottom side of module 118. Depending on which of the two positions storage device 100 is placed in, either left bottom air vent 238 (e.g., for the first position) may facilitate (at least a portion of) the airflow, or right bottom air vent 240 (e.g., for the second position) may facilitate (at least a portion of) the airflow.

For example, as heat generated by storage device 100 is dissipated by housing 200, a portion of the heat conducted to a bottom portion of housing 200 may be dissipated by convection as the portion of the airflow contacts the bottom portion of housing 200.

By allowing air to flow in and/or out of these air vents (the air contacting various portions of storage device 100 responsible for generating various respective portions of the heat), dissipation of the heat by convection may be enhanced.

Although illustrated in FIG. 1E with an example topology, a module (e.g., 118) may include different types and/or arrangements of air vents. For additional information regarding the dissipation of the heat by convection, refer to FIGS. 1F-1G below.

Figure 1F:
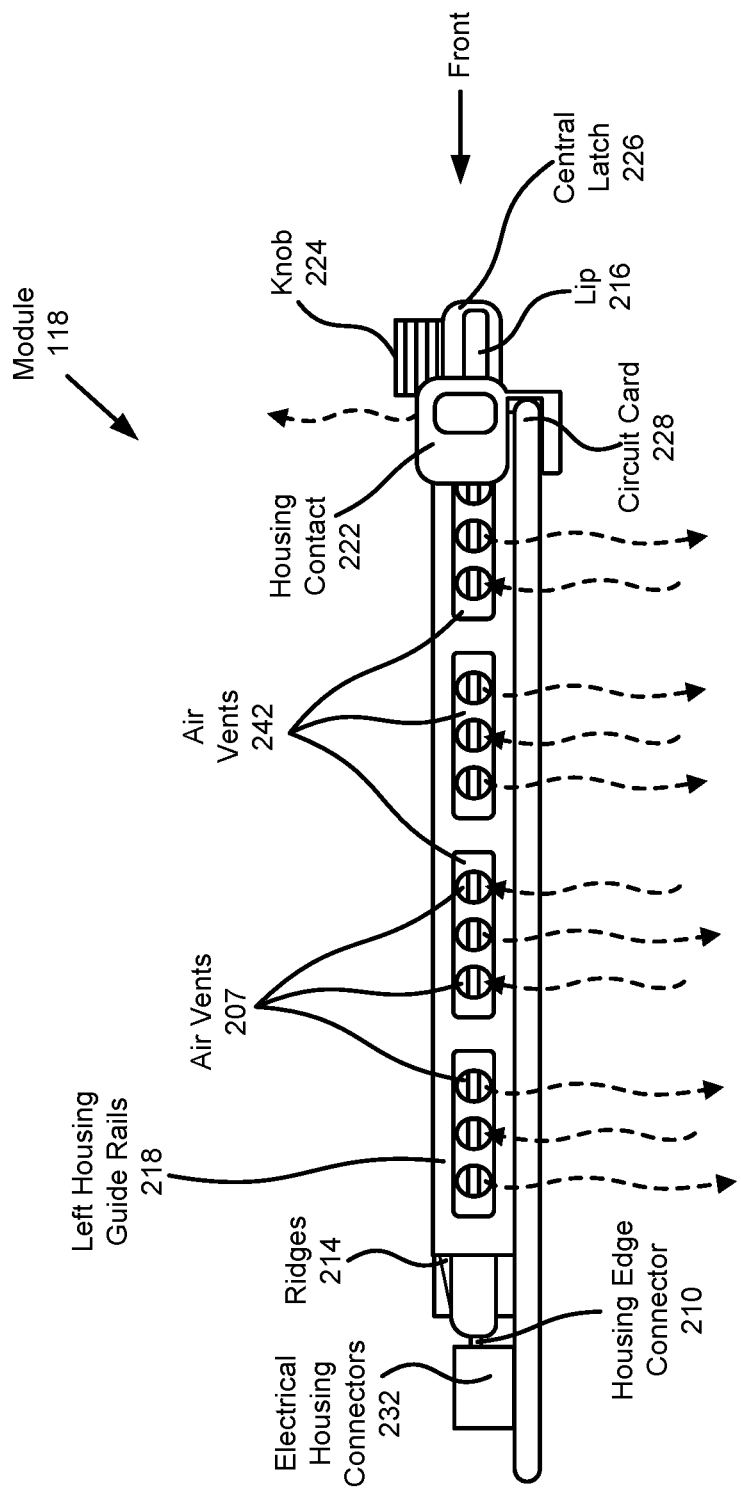

Turning to FIG. 1F, a diagram illustrating a side view of module 118 in accordance with an embodiment is shown. As previously mentioned, modules (e.g., 118) may be adapted to enhance dissipation of heat generated by storage devices (e.g., 100). To do so, and as shown in FIG. 1F, module 118 may further include air vents 242.

Similar to air vents 206-207 (discussed with regard to FIGS. 1C-1D), air vents 242 may be adapted to facilitate at least a portion of airflow being circulated by, for example, the cooling system mentioned with regard to FIG. 1B.

To facilitate (at least a portion of) the airflow, air vents 242 may be implemented as a number of gaps positioned on a side of module 118 (e.g., air vents 242 may be gaps in the structure of left and/or right housing guide rails 218-220). For example, air flow guided by air vents 206-207 may be further guided through air vents 242. Thus, the airflow may be guided through the sides of module 118, and away from storage device 100 (and thus, away from data processing system 108). By guiding the airflow away from storage device 100 using air vents to facilitate the guidance, the dissipation of the heat may be enhanced.

It will be appreciated that various portions of the airflow are illustrated in FIG. 1F using wavy, dashed lines. The dashed lines may represent airflow that is guided in and/or out of each air vent (the direction of each portion indicated by black arrows included on the dashed lines. However, it will also be appreciated that a dashed line illustrated nearest the front end of module 118 may represent a portion of the airflow guided through air vents 236 (discussed with regard to FIG. 1E).

Although illustrated in FIG. 1F with an example airflow, a module (e.g., 118) may include different types and/or arrangements of air vents that facilitate different paths of airflow. For additional information regarding the dissipation of the heat by convection, refer to FIG. 1G below.

Figure 1G:
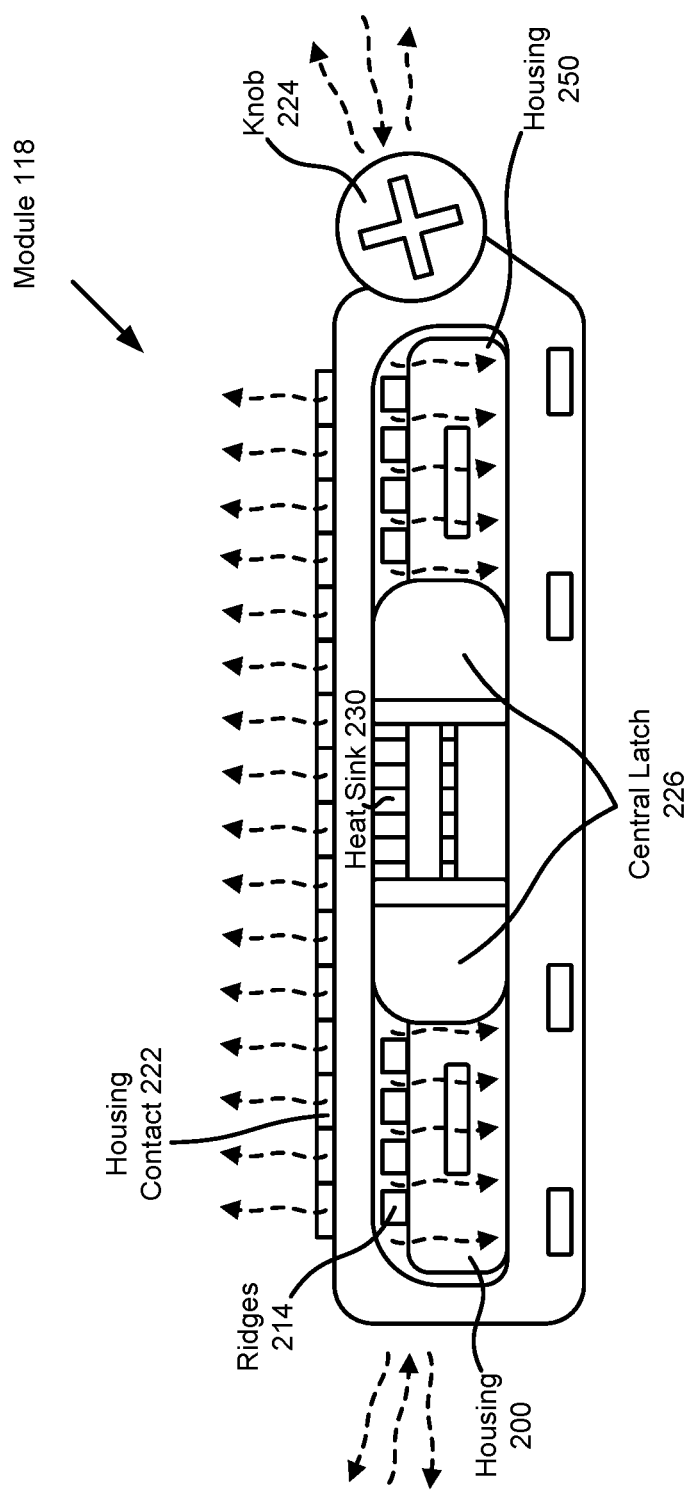

Turning to FIG. 1G, a diagram illustrating a front view of module 118 in accordance with an embodiment is shown. As previously discussed with regard to FIGS. 1C-1F, modules (e.g., 118) may be adapted to enhance dissipation of heat generated by storage devices (e.g., 100). As shown in FIG. 1G, various portions of the airflow circulated by, for example, the cooling system mentioned with regard to FIG. 1B, are illustrated using wavy, dashed lines.

Accordingly, FIG. 1G illustrates a front view of module 118 as the various portions of the airflow facilitate the dissipation of the heat by convection. For example, dashed lines pointing down from ridges 214 (and dashed lines pointing upward from housing contact 222) may represent at least a portion of the airflow that escapes module 118 after being guided by the airflow channels of ridges 214. This portion of the airflow may diverge to escape module 118 through the space in which housing 200 may be inserted/removed from module 118, and/or through air vents 236.

Additionally, for example, dashed lines pointing toward/away from the lateral sides of module 118 may represent the portions of the airflow that escape module 118 through air vents 242.

Although illustrated in FIG. 1G with an example airflow, a module (e.g., 118) may include different types and/or arrangements of air vents that facilitate different paths of airflow.

Furthermore, as shown in FIG. 1G and as previously mentioned, module 118 may hold more than one storage device. For example, module 118 may hold housing 200 (which houses storage device 100) and housing 250 (which may house a second storage device). For additional information regarding the storage devices held by module 118, refer to FIG. 1H below.

Figure 1H:
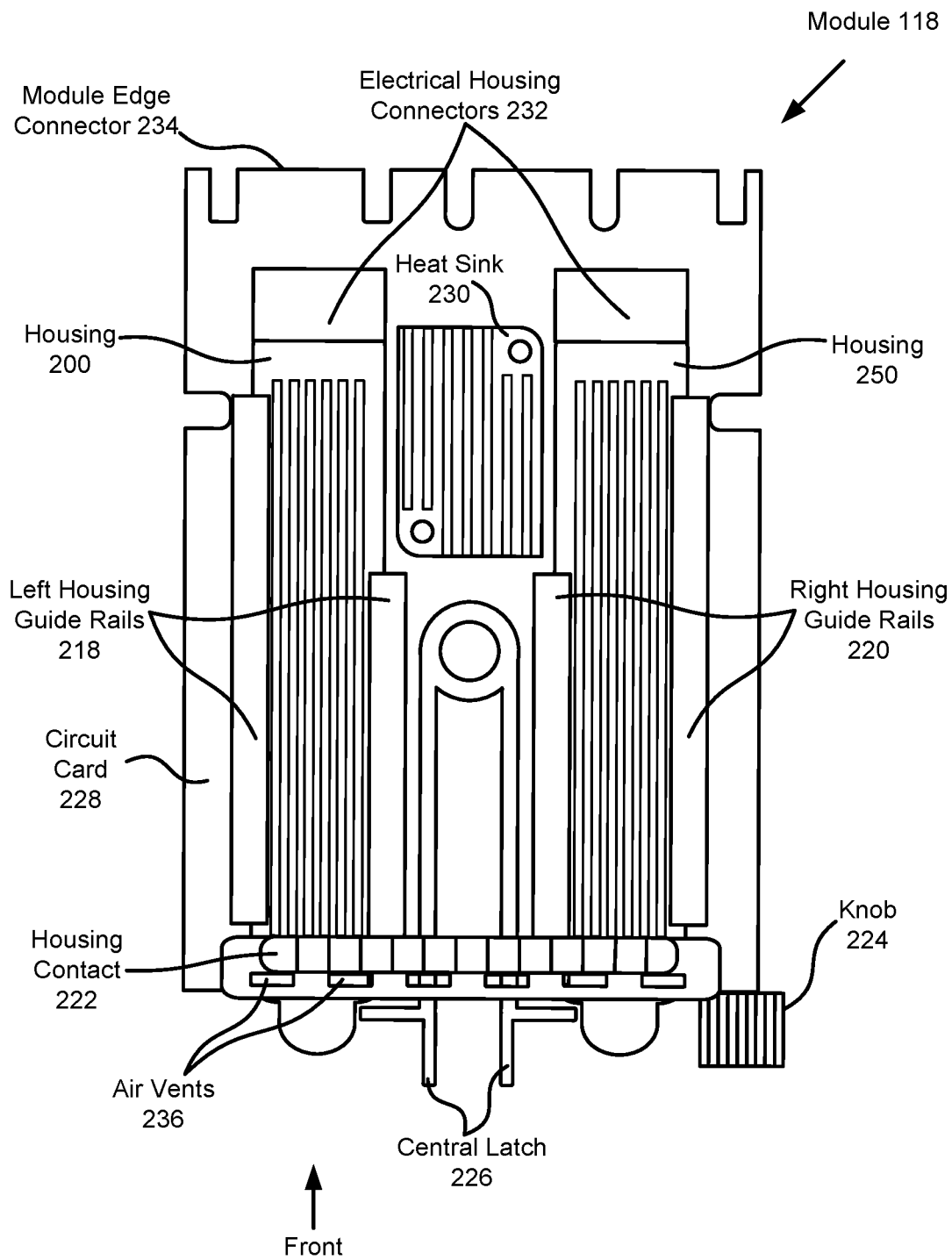

Turning to FIG. 1H, a diagram illustrating a top view of module 118 in accordance with an embodiment is shown. As shown in FIG. 1H, a first storage device (e.g., 100) may be placed in the first position (out of the two positions discussed with regard to FIG. 1E), and a second storage device may be placed in the second position. For example, storage device 100 may be positioned within housing 200, and the second storage device may be positioned within housing 250.

While illustrated in FIG. 1H with a limited number of specific components, a module may include additional, fewer, and/or different components without departing from embodiments disclosed herein.

By utilizing modules (e.g., 118) and/or housing structures (e.g., 200) in which storage devices (e.g., 100) may be positioned, as discussed in embodiments herein, dissipation of heat generated by the storage devices may be enhanced. Thus, power consumed by a data processing system to cool the storage devices may become more efficient despite an inability of the data processing system to granularly cool components of the data processing system.

Furthermore, by enhancing the dissipation of the heat, a likelihood of the computer implemented services being delayed and/or prevented entirely may be reduced.

Figure 2:
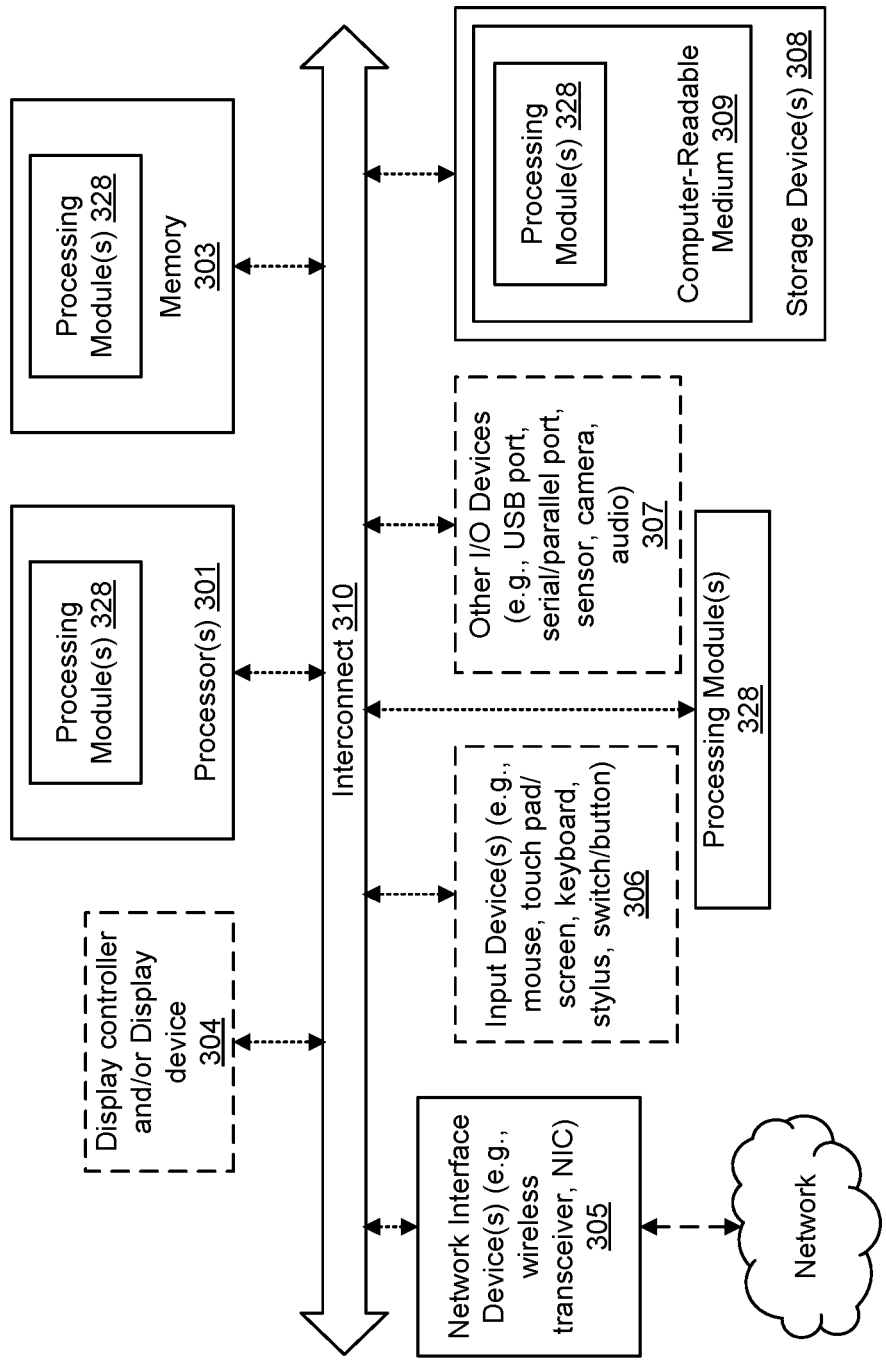
FIG. 2 shows a block diagram illustrating a data processing system in accordance with an embodiment.

Any of the components illustrated in FIGS. 1A-1H may be implemented with one or more computing devices. Turning to FIG. 2, a block diagram illustrating an example of a data processing system (e.g., a computing device) in accordance with an embodiment is shown. For example, system 300 may represent any of data processing systems described above performing any of the processes or methods described above. System 300 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 300 is intended to show a high-level view of many components of the computer system. However, it is to be understood that additional components may be present in certain implementations and furthermore, different arrangement of the components shown may occur in other implementations. System 300 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 300 includes processor 301, memory 303, and devices 305-307 via a bus or an interconnect 310. Processor 301 may represent a single processor or multiple processors with a single processor core or multiple processor cores included therein. Processor 301 may represent one or more general-purpose processors such as a microprocessor, a central processing unit (CPU), or the like. More particularly, processor 301 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 301 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 301, which may be a low power multi-core processor socket such as an ultra-low voltage processor, may act as a main processing unit and central hub for communication with the various components of the system. Such processor can be implemented as a system on chip (SoC). Processor 301 is configured to execute instructions for performing the operations discussed herein. System 300 may further include a graphics interface that communicates with optional graphics subsystem 304, which may include a display controller, a graphics processor, and/or a display device.

Processor 301 may communicate with memory 303, which in one embodiment can be implemented via multiple memory devices to provide for a given amount of system memory. Memory 303 may include one or more volatile storage (or memory) devices such as random-access memory (RAM), dynamic RAM (DRAM), synchronous DRAM (SDRAM), static RAM (SRAM), or other types of storage devices. Memory 303 may store information including sequences of instructions that are executed by processor 301, or any other device. For example, executable code and/or data of a variety of operating systems, device drivers, firmware (e.g., input output basic system or BIOS), and/or applications can be loaded in memory 303 and executed by processor 301. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 300 may further include IO devices such as devices (e.g., 305, 306, 307, 308) including network interface device(s) 305, optional input device(s) 306, and other optional IO device(s) 307. Network interface device(s) 305 may include a wireless transceiver and/or a network interface card (NIC). The wireless transceiver may be a Wi-Fi transceiver, an infrared transceiver, a Bluetooth transceiver, a WiMAX transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 306 may include a mouse, a touch pad, a touch sensitive screen (which may be integrated with a display device of optional graphics subsystem 304), a pointer device such as a stylus, and/or a keyboard (e.g., physical keyboard or a virtual keyboard displayed as part of a touch sensitive screen). For example, input device(s) 306 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 307 may include an audio device. An audio device may include a speaker and/or a microphone to facilitate voice-enabled functions, such as voice recognition, voice replication, digital recording, and/or telephony functions. Other IO devices 307 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 307 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 310 via a sensor hub (not shown), while other devices such as a keyboard or thermal sensor may be controlled by an embedded controller (not shown), dependent upon the specific configuration or design of system 300.

To provide for persistent storage of information such as data, applications, one or more operating systems and so forth, a mass storage (not shown) may also couple to processor 301. In various embodiments, to enable a thinner and lighter system design as well as to improve system responsiveness, this mass storage may be implemented via a solid-state device (SSD). However, in other embodiments, the mass storage may primarily be implemented using a hard disk drive (HDD) with a smaller amount of SSD storage to act as an SSD cache to enable non-volatile storage of context state and other such information during power down events so that a fast power up can occur on re-initiation of system activities. Also, a flash device may be coupled to processor 301, e.g., via a serial peripheral interface (SPI). This flash device may provide for non-volatile storage of system software, including a basic input/output software (BIOS) as well as other firmware of the system.

Storage device 308 may include computer-readable storage medium 309 (also known as a machine-readable storage medium or a computer-readable medium) on which is stored one or more sets of instructions or software (e.g., processing module, unit, and/or processing module/unit/logic 328) embodying any one or more of the methodologies or functions described herein. Processing module/unit/logic 328 may represent any of the components described above. Processing module/unit/logic 328 may also reside, completely or at least partially, within memory 303 and/or within processor 301 during execution thereof by system 300, memory 303 and processor 301 also constituting machine-accessible storage media. Processing module/unit/logic 328 may further be transmitted or received over a network via network interface device(s) 305.

Computer-readable storage medium 309 may also be used to store some software functionalities described above persistently. While computer-readable storage medium 309 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of embodiments disclosed herein. The term "computer-readable storage medium" shall accordingly be taken to include, but not be limited to, solid-state memories, and optical and magnetic media, or any other non-transitory machine-readable medium.

Processing module/unit/logic 328, components and other features described herein can be implemented as discrete hardware components or integrated in the functionality of hardware components such as ASICS, FPGAs, DSPs or similar devices. In addition, processing module/unit/logic 328 can be implemented as firmware or functional circuitry within hardware devices. Further, processing module/unit/logic 328 can be implemented in any combination hardware devices and software components.

Note that while system 300 is illustrated with various components of a data processing system, it is not intended to represent any particular architecture or manner of interconnecting the components as such details are not germane to embodiments disclosed herein. It will also be appreciated that network computers, handheld computers, mobile phones, servers, and/or other data processing systems which have fewer components, or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g., circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope of the embodiments disclosed herein as set forth in the following claims. The specification and drawings are, accordingly, to be regarded in an illustrative sense rather than a restrictive sense.

What is claimed is:

1. A storage device, comprising:
   a circuit card;
   a chip:
      positioned on the circuit card, and
      adapted to:
         store data, and
         generate heat as a byproduct of storing data; and
   a connector:
      positioned with the circuit card, and
      adapted to facilitate formation of operable connections between the chip and other devices; and
   a housing adapted to enhance thermal dissipation of the heat in an airflow, the housing comprising:
      a housing top adapted to dissipate a first portion of heat, the housing top comprising:
         ridges adapted to provide a surface area to which a first portion of the airflow is exposed, and
      a housing bottom adapted to dissipate a second portion of the heat, the housing bottom comprising:
         air vents adapted to facilitate a second portion of the airflow that dissipates a first sub portion of the second portion of the heat.

2. The storage device of claim 1, further comprising:
   a module adapted to position the housing to be exposed to the airflow, comprising:
      a housing contact comprising a first set of air vents,
      guide rails comprising a second set of air vents, and
      a circuit card comprising a third set of air vents.

3. The storage device of claim 2, wherein the module further comprises:
   a storage controller adapted to manage access to data redundantly stored in the storage device and a second storage device.

4. The storage device of claim 3, further comprising:
   the second storage device; and
   a second housing for housing the second storage device, wherein the second housing is substantially similar to the housing.

5. The storage device of claim 2, wherein the housing further comprises:
   an interposer adapted to route the data stored in the storage device to a storage controller positioned on the module, the interposer comprising:
      a housing edge connector:
         positioned with a rear end of the housing,
         adapted to facilitate formation of operable connections between the storage device and the module while the housing is positioned in the module; and
      an electrical storage connector:
         positioned on a circuit card of the interposer, the circuit card comprising the housing edge connector, and
         adapted to facilitate formation of operable connections between the storage device and the housing edge connector.

6. The storage device of claim 5, wherein the first portion of the airflow is aligned with a length of the ridges.

7. The storage device of claim 6, wherein the second portion of the airflow traverses from being outside of the housing, through the air vents of the housing bottom to an interior of the housing, and interacts with the storage device while the storage device is positioned in the housing.

8. The storage device of claim 7, wherein the second portion of the airflow cools a portion of the storage device that is not substantially cooled by the housing through thermal conduction.

9. The storage device of claim 7, wherein the second portion of the airflow further traverses through the second set of air vents while the storage device is positioned in the module.

10. The storage device of claim 7, wherein the airflow comprises a third portion that traverses through the third set of air vents, and interacts with the housing bottom to dissipate a second sub portion of the second portion of the heat.

11. A computing complex, comprising:
    a processor, and
    a storage device, comprising:
       a circuit card,
       a chip:
          positioned on the circuit card, and
          adapted to:

store data, and
generate heat as a byproduct of storing data, and
a connector:
position with the circuit card, and
adapted to facilitate formation of operable connections between the chip and other devices, and
a housing adapted to enhance thermal dissipation of the heat in an airflow, the housing comprising:
a housing top adapted to dissipate a first portion of heat, the housing top comprising:
ridges adapted to provide a surface area to which a first portion of the airflow is exposed, and
a housing bottom adapted to dissipate a second portion of the heat, the housing bottom comprising:
air vents adapted to facilitate a second portion of the airflow that dissipates a first sub portion of the second portion of the heat.

12. The computing complex of claim 11, further comprising:
a module adapted to position the housing to be exposed to the airflow, comprising:
a housing contact comprising a first set of air vents,
guide rails comprising a second set of air vents, and
a circuit card comprising a third set of air vents.

13. The computing complex of claim 12, wherein the housing further comprises:
an interposer adapted to route the data stored in the storage device to a storage controller positioned on the module, the interposer comprising:
a housing edge connector:
positioned with a rear end of the housing,
adapted to facilitate formation of operable connections between the storage device and the module while the housing is positioned in the module; and
an electrical storage connector:
positioned on a circuit card of the interposer, the circuit card comprising the housing edge connector, and
adapted to facilitate formation of operable connections between the storage device and the housing edge connector.

14. The computing complex of claim 12, wherein the module further comprises:
a storage controller adapted to manage access to data redundantly stored in the storage device and a second storage device.

15. The computing complex of claim 14, further comprising:
the second storage device; and
a second housing for housing the second storage device, wherein the second housing is substantially similar to the housing.

16. A data processing system, comprising:
a chassis,
a computing complex, comprising:
a processor, and
a storage device, comprising:
a circuit card,
a chip:
positioned on the circuit card, and
adapted to:
store data, and
generate heat as a byproduct of storing data, and
a connector:
positioned with the circuit card, and
adapted to facilitate formation of operable connections between the chip and other devices, and
a housing adapted to enhance thermal dissipation of the heat in an airflow, the housing comprising:
a housing top adapted to dissipate a first portion of heat, the housing top comprising:
ridges adapted to provide a surface area to which a first portion of the airflow is exposed, and
a housing bottom adapted to dissipate a second portion of the heat, the housing bottom comprising:
air vents adapted to facilitate a second portion of the airflow that dissipates a first sub portion of the second portion of the heat.

17. The data processing system of claim 16, further comprising:
a module adapted to position the housing to be exposed to the airflow, comprising:
a housing contact comprising a first set of air vents,
guide rails comprising a second set of air vents, and
a circuit card comprising a third set of air vents.

18. The data processing system of claim 17, wherein the housing further comprises:
an interposer adapted to route the data stored in the storage device to a storage controller positioned on the module, the interposer comprising:
a housing edge connector:
positioned with a rear end of the housing,
adapted to facilitate formation of operable connections between the storage device and the module while the housing is positioned in the module; and
an electrical storage connector:
positioned on a circuit card of the interposer, the circuit card comprising the housing edge connector, and
adapted to facilitate formation of operable connections between the storage device and the housing edge connector.

19. The data processing system of claim 17, wherein the module further comprises:
a storage controller adapted to manage access to data redundantly stored in the storage device and a second storage device.

20. The data processing system of claim 19, further comprising:
the second storage device; and
a second housing for housing the second storage device, wherein the second housing is substantially similar to the housing.

* * * * *